United States Patent
Aksu et al.

(10) Patent No.: US 7,892,413 B2
(45) Date of Patent: Feb. 22, 2011

(54) ELECTROPLATING METHODS AND CHEMISTRIES FOR DEPOSITION OF COPPER-INDIUM-GALLIUM CONTAINING THIN FILMS

(75) Inventors: Serdar Aksu, Milpitas, CA (US); Jiaxiong Wang, Castro Valley, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 0 days.

(21) Appl. No.: 12/371,546

(22) Filed: Feb. 13, 2009

(65) Prior Publication Data
US 2009/0283415 A1 Nov. 19, 2009

Related U.S. Application Data

(63) Continuation-in-part of application No. 12/123,372, filed on May 19, 2008, and a continuation-in-part of application No. 11/535,927, filed on Sep. 27, 2006, now Pat. No. 7,507,321.

(60) Provisional application No. 61/150,721, filed on Feb. 6, 2009.

(51) Int. Cl.
C25D 3/56 (2006.01)
C25D 3/58 (2006.01)
C25D 3/62 (2006.01)

(52) U.S. Cl. ............ 205/238; 205/239; 205/247; 205/251

(58) Field of Classification Search ............ 205/238, 205/239, 247, 251
See application file for complete search history.

(56) References Cited

U.S. PATENT DOCUMENTS

| | | | |
|---|---|---|---|
| 2,582,377 A | 1/1952 | Brown | |
| 2,793,179 A | 5/1957 | De La Breteque | |
| 2,873,232 A | 2/1959 | Zimmerman | |
| 3,061,528 A | 10/1962 | Foley, Jr. | |
| 4,199,416 A * | 4/1980 | Middleton et al. | 205/239 |
| 4,452,675 A * | 6/1984 | Cipris et al. | 205/50 |
| 4,488,942 A | 12/1984 | Martin et al. | |
| 4,581,108 A | 4/1986 | Kapur et al. | |
| 4,798,660 A | 1/1989 | Ermer et al. | |
| 5,215,631 A | 6/1993 | Westfall | |
| 5,275,714 A | 1/1994 | Bonnet et al. | |
| 5,304,403 A | 4/1994 | Schlesinger et al. | |
| 5,489,372 A | 2/1996 | Hirano | |
| 5,501,786 A | 3/1996 | Gremion | |
| 5,554,211 A | 9/1996 | Bokisa et al. | |
| 5,695,627 A | 12/1997 | Nakazawa | |
| 5,730,852 A | 3/1998 | Bhattacharya | |
| 5,804,054 A | 9/1998 | Bhattacharya | |
| 5,871,630 A | 2/1999 | Bhattacharya | |
| 5,976,614 A | 11/1999 | Bhattacharya et al. | |
| 6,048,442 A | 4/2000 | Kushiya et al. | |
| 6,602,440 B2 | 8/2003 | Bishop et al. | |
| 6,852,210 B2 * | 2/2005 | Obata et al. | 205/238 |
| 7,297,868 B2 | 11/2007 | Bhattacharya | |
| 7,507,321 B2 | 3/2009 | Aksu et al. | |
| 2004/0206390 A1 | 10/2004 | Bhattacharya | |
| 2005/0173255 A1 * | 8/2005 | Bokisa et al. | 205/255 |
| 2005/0215079 A1 | 9/2005 | Taunier et al. | |
| 2006/0151331 A1 | 7/2006 | Taunier et al. | |
| 2007/0116893 A1 | 5/2007 | Zwaap et al. | |
| 2007/0272558 A1 | 11/2007 | Aksu et al. | |
| 2009/0283411 A1 | 11/2009 | Aksu et al. | |
| 2009/0283414 A1 | 11/2009 | Wang et al. | |

FOREIGN PATENT DOCUMENTS

| | | |
|---|---|---|
| EP | 0251302 | 1/1988 |
| EP | 1103637 | 5/2001 |
| FR | 2849532 | 7/2004 |
| JP | 08120479 A * | 5/1996 |

OTHER PUBLICATIONS

Donglin et al., "Co-electrodeposition and Characterization of Cu(In,Ga)Se2 Thin Films", J. Mater. Sci. (no month, 2006), vol. 41, pp. 1875-1878.*

Su et al., "Electrodeposition of CuInSe sub 2 Film by One Step Method", Materials Protection (China), vol. 31, No. 7, pp. 8-9. Jul. 1998.*

(Continued)

*Primary Examiner*—Edna Wong
(74) *Attorney, Agent, or Firm*—Pillsbury Winthrop Shaw Pittman LLP

(57) ABSTRACT

Described is an electrodeposition solution for deposition of a Group IB-IIIA thin film on a conductive surface. In a preferred embodiment, the electrodeposition solution comprises a solvent; a Group IB material source that dissolves in the solvent and provides a Group IB material; a Group IIIA material source that dissolves in the solvent and provides a Group IIIA material; and a blend of at least two complexing agents, one of the at least two complexing agent forming a complex with the Group IB material and the other one of the at least two complexing agent forming a complex with the Group IIIA material; wherein the pH of the solution is at least 7.

16 Claims, 1 Drawing Sheet

OTHER PUBLICATIONS

Ganchev et al., "Preparation of Cu(In,Ga)Se2 Layers by Selenization of Electrodeposited CU-IN-GA Precursors", Thin Solid Films, vol. 511-512, 2006, pp. 325-327.

Ganchev et al., "Investigation of the Electrodeposition Process in the Cu-In-Se System", Solar Energy and Mats and Solar Cels, vol. 31, 1993, pp. 163-170.

Herrero, et al., "Electrodeposition of Cu-In Alloys for Preparationg CuInS2 Thin Films", Solar Energy Materials, vol. 20, 1990, pp. 53-65.

Hodes, et al., "Electroplated CuInS2 and CuInSe2 Layers: Preparation and Physical and Photovoltaic Characterization", Thin Solid Films, vol. 128, 1985, pp. 93-106.

Ishizaki et al., "The Effect of Citric Acid and EDTA Addition on Cu-In Alloy Electrochemical Deposition", Mat. Transactions, JIM, vol. 40, 1999, pp. 867-870.

Jost et al., "Real time Investigations on the Formation of CuInSe2 Thin Film Solar Cell Absorbers from Electrodeposited Precursors", Solar Energy Mats and Solar Cells, vol. 91, 2007, pp. 636-644.

Kampman, et al., "A Cadmium-free CuInSe2 Superstrate Solar Cell Fabricated by Electrodeposition Using a ITO/In2Se3/CuInSe2/Au Structure", Progress in Photovoltaics, vol. 7, 1999, pp. 129-135.

Kampman et al., "Large Area Electrodeposition of Cu(In,Ga)Se2", Thin Solid Films, vol. 361-362, 2000, pp. 309-313.

Kumar, et al., "Rapid Thermal Annealing of Cu-In/Se Stacked Layers", Semiconductor Science and Tech,, vol. 6, 1991, pp. 940-941.

Lockhande et al. , "Preparation of CuInSe2 and CuInS2 Films by Reactive Annealing in H2Se or H2S*", Solar Cells, vol. 21, 1987. pp. 215-224.

Prosini, et al., "Electrodeposition of Copper-Indium Alloy Under Diffusion-Limiting Current Control", Thin Solid Films, vol. 288, 1996, pp. 90-94.

Singh, et al., "Electrodeposited Semiconducting CuInSe2 Films: I. Preparation, Structural and Electrical Characterisation", J. Phys, D.: Applied Phys., vol. 19, 1986, pp. 1299-1309.

Andreoli, et al., "Electrochemical Approaches to $GaAs_{1-x}Sb_x$ Thin Films", J. Electroanalyt. Chem., vol. 385, 1995, p. 265-268.

Backris, et al., "Electrodepotiion of Gallium on Liquid and Solid Gallium Electrodes in Alkaline Solutions", J. Electrochem. Soc., vol. 109, 1962, p. 48.

Bhattacharya, R.N., et al., "$CuIn_{1-x}Ga_xSe_2$-based Photovoltaic Cells from Electrodeposited Precursor Films", Solar Energy Mats & Solar Cells, vol. 76, 2003, pp. 331-337.

Binsma, J.J., et al., "Preparation of Thin $CuInS_2$ Films via a Two Stage Process", Thin Solid Films, 97, 1982, pp. 237-243.

Bouabid et al., "CuIn1-xGaxSe2 Thin Films Prepared by one Step Electrodeposition", J. Phys IV France, vol. 123 (no month, 2005), pp. 53-57.

Calixto, M.E., et al., "$CuInSe_2$ Thin Films Formed by Selenization of Cu-In Precursors", J. of Mats. Sci., 33, 1998, pp. 339-345.

Fernandez, et al., "Electroeposited and Selenized ($CuInSe_2$) (CIS) Thin Films for Photovoltaic Applications", Solar Energy Materials and Solar Cells,52, 1998, pp. 423-431.

Friedfeld, R., et al., "Electrodeposition of $CuIn_xGa_{1-x}Se_2$ Thin Films", Solar Energy Mats. & Solar Cells, 58, 1999, pp. 375-385.

Fritz, H.P., et al., "A New Electrochemical Method for Selenization of Stacked CuIn Layers and Preparation of $CuInSe_2$ by Thermal Annealing", Thin Solid Films, 247, 1994, pp. 129-133.

Grindle, S.P., et al., "Preparation and Properties of $CuInS_2$ Thin Films Produced by Exposing rf-Sputtered Cu-In Films to an $H_2S$ Atmosphere", Appl. Phys. Lett, 35(1) Jul. 1, 1979, pp. 24-26.

Guillen, C., et al., "New Approaches to Obtain $CuIn_{1-x}Ga_xSe_2$ Thin Films by Combining Electrodeposited and Evaporated Precursors", Thin Solid Films, 323, 1998, pp. 93-98.

Guillen, C.,et al., "$CuInSe_2$ Thin Films Obtained by a Novel Electrodeposition and Sputtering Combined Method," Vacuum, 58, 2000, pp. 594-601.

Gupta, A., et al., "$CuInS_2$ Films Prepared by Sulfurization of Electroless Deposited Cu-In Alloy", Solar Energy Mats., 18, 1988, pp. 1-8.

Kampmann, A., et al., "Electrodeposition of CIGS on Metal Substrates", Mat. Res. Soc. Symp. Proc., 763, 2003, pp. B8.5.1-B8.5.6.

Kapur, V.K., et al., "Low Cost Thin Film Chalcopyrite Solar Cells", IEEE, 1985, p. 1429-1432.

Kapur, V.K., et al., "Low Cost Methods for the Production of Semiconductor Films for $CuInSe_2$/CdS Solar Cells", Solar Cells, 21, 1987, pp. 65-72.

Kim, et al., "Preparation of $CuInSe_2$ Thin Films Using Electrodeposited In/Cu Metallic Layer", First WCPEC, Dec. 5-9, 1994, Hawaii, IEEE, pp. 202-205.

Kumar, et al., "Properties of $CuInSe_2$ Films Prepared by the Rapid Thermal Annealing Technique", Thin Solid Films, 223, 1993, pp. 109-113.

Lokhande, C., et al., "Preparation of $CuInSe_2$ and $CuInS_2$ Films by Reactive Annealing in $H_2$ $Se_2$ or $H_2$ S", Solar Cells,, 21, 1987, pp. 215-224.

Sundararajan, et al., "The Electrodeposition of Gallium from a Chloride Bath", J. Less. Comm. Metals., vol. 11, 1966, p. 360-364.

Taunier, S., et al., "$Cu(In,Ga)(S,Se)_2$ Solar Cells and Modules by Electrodeposition", Thin Solid Films, 480-481, 2005, pp. 526-531.

Wijesundera, R.P., et al., "Preparation of $CuInS_2$ Thin Films by Electrodeposition and Sulphurisation for Applications in Solar Cells", Solar Energy Mats. & Solar Cells, 81, 2004, pp. 147-154.

Zank, J., et al., "Electrochemical Codeposition of Indium and Gallium for Chalcopyrite Solar Cells", Thin Solid Films, 286, 1996, pp. 259-263.

Xia, et al., "Influence of Na Citrate Concentration on Cu(In,Ga)Se2 Thin Films by Electrodeposition", Regong Jingti Xuebau, (Aug. 2005), vol. 34, No. 4, pp. 704-708.

Fernandez, A.M., "Optimisation of the Electochemical Bath for Growing Device-Quality $CuInSe_2$ Thin Films", Advanced materials for Optics and Electronics, vol. 8 1998, pp. 1-8.

Fernandez, A.M., "Electrodeposited and Selenized ($CuInSe_2$) (CIS) Thin Films for Photovoltaic Applications", Solar Energy Materials and Solar Cells, vol. 52, 1998, pp. 423-431.

Fernandez, A.M., et al. "Electrodeposition of $CuInSe_2$ Thin Films for Photovoltaic Application", WRECT 1996, pp. 396-399.

Hermann, et al., "Low-cost Deposition of $CuInSe_2$ (CIS) Films for CdS/CIS Solar Cells", Solar Energy Materials and Solar Cells, vol. 52, 1998, pp. 355-360.

Herrero, et al., "Electrochemical Synthesis of Photoactive $In_2Se_3$ Thin Films", Solar Energy Materials, vol. 16, 1987 pp. 477-485.

Igasaki, et al., "The Preparation of Highly Oriented InSe Films by Electrodeposition", J. of Crystal Growth, vol. 158, 1996, pp. 268-275.

Kampmann, et al., "Large Area Electrodeposition of $Cu(In,Ga)Se_2$", Thin Solid Films, vol. 361-362, 2000, pp. 309-313.

Massaccesi, et al., "Electrodeposition of Indium Selenide $In_2$ $Se_3$", J. of Electroanalytical Chem., vol. 412, 1996, pp. 95-101.

Thouin, et al., "formation of Copper Indium Diselenide by Electrodeposition", J. of Electroanalytical Chem., vol. 374, 1994, pp. 81-88.

Yukawa, et al., "Electrodeposition of $CuInS_2$ from Aqueous Solution Part I. Electrodeposition of Cu-S Film", Thin Solid Film, vol. 280, 1996, pp. 160-162.

* cited by examiner

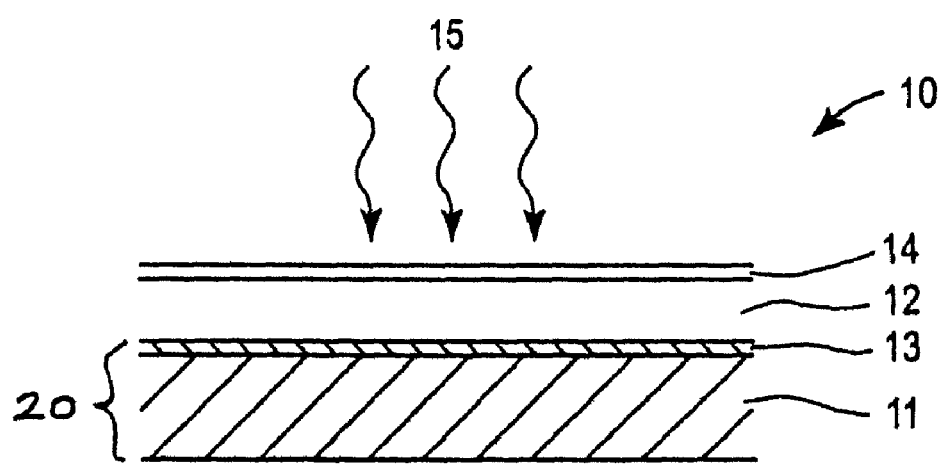
PRIOR ART    FIG. 1

ELECTROPLATING METHODS AND CHEMISTRIES FOR DEPOSITION OF COPPER-INDIUM-GALLIUM CONTAINING THIN FILMS

CLAIM OF PRIORITY

This application is a Continuation-in-Part of U.S. patent application Ser. No. 12/123,372, filed May 19, 2008, entitled "ELECTROPLATING METHODS AND CHEMISTRIES FOR DEPOSITION OF GROUP IIIB-GROUP VIA THIN FILMS," and this application is a Continuation-in-Part of U.S. patent application Ser. No. 11/535,927, filed on Sep. 27, 2006, entitled "EFFICIENT GALLIUM THIN FILM ELECTROPLATING METHODS AND CHEMISTRIES," now U.S. Pat. No. 7,507,321 and this application also relates to and claims priority from U.S. Provisional Application No. 61/150,721, filed Feb. 6, 2009, entitled "ELECTROPLATING METHODS AND CHEMISTRIES FOR DEPOSITION OF COPPER-INDIUM-GALLIUM CONTAINING THIN FILMS", all of which are expressly incorporated herein by reference.

BACKGROUND

1. Field of the Inventions

These inventions relate to electroplating methods and solutions and, more particularly, to methods and electroplating solution chemistries for co-electrodeposition of Group IB and Group IIIA metallic thin films on a conductive surface to form metallic Group IB-Group IIIA alloys or mixtures with predetermined composition or stoichiometry. The inventions also relate to electrodeposition of Group IBIIIAVIA layers in compound, alloy or mixture form.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (copper (Cu), silver (Ag), gold (Au)), Group IIIA (boron (B), aluminum (Al), gallium (Ga), indium (In), thallium (Ti)) and Group VIA (oxygen (0), sulfur (S), selenium (Se), tellurium (Te), polonium (Po)) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a base 20 including a substrate 11 and a conductive layer 13. The substrate can be a sheet of glass, a sheet of metal, an insulating foil or web, or a conductive foil or web. The absorber film 12, which comprises a material in the family of $Cu(In,Ga,Al)(S,Se,Te)_2$, is grown over the conductive layer 13, which is previously deposited on the substrate 11 and which acts as the electrical contact to the device. Various conductive layers comprising molybdenum (Mo), tantalum (Ta), tungsten (W), titanium (Ti), and stainless steel etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a cadmium sulfide (CdS), zinc oxide (ZnO) or CdS/ZnO stack is formed on the absorber film. Radiation 15 enters the device through the transparent layer 14. Metallic grids (not shown) may also be deposited over the transparent layer 14 to reduce the effective series resistance of the device. A variety of materials, deposited by a variety of methods, can be used to provide the various layers of the device shown in FIG. 1. It should be noted that although the chemical formula for a CIGS(S) layer is often written as $Cu(In,Ga)(S,Se)_2$, a more accurate formula for the compound is $Cu(In,Ga)(S,Se)_k$, where k is typically close to 2 but may not be exactly 2. For simplicity, the value of k will be used as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The first technique that yielded high-quality Cu(In,Ga)Se, films for solar cell fabrication was co-evaporation of Cu, In, Ga and Se onto a heated substrate in a vacuum chamber. Another technique for growing $Cu(In,Ga)(S,Se)_2$ type compound thin films for solar cell applications is a two-stage process where at least two components of the $Cu(In,Ga)(S,Se)_2$ material are first deposited onto a substrate, and then reacted with S and/or Se in a high temperature annealing process. For example, for $CuInSe_2$ growth, thin layers of Cu and In may be first deposited on a substrate and then this stacked precursor layer may be reacted with Se at elevated temperature. If the reaction atmosphere also contains sulfur, then a $CuIn(S,Se)_2$ layer can be grown. Addition of Ga in the precursor layer, for example use of a Cu/In/Ga stacked film precursor, allows the growth of a $Cu(In,Ga)(S,Se)_2$ absorber.

Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of a gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer and an In layer to form a Cu—Ga/In stack on a metallic back electrode layer and then reacting this precursor stack film with one of Se and S to form the absorber layer. Such techniques may yield good quality absorber layers and efficient solar cells, however, they suffer from the high cost of capital equipment, and relatively slow rate of production.

One prior art method described in U.S. Pat. No. 4,581,108 utilizes a low cost electrodeposition approach for metallic precursor preparation for a two-stage processing technique. In this method a Cu layer is first electrodeposited on a substrate. This is then followed by electrodeposition of an In layer forming a Cu/In stack during the first stage of the process. In the second stage of the process, the electrodeposited Cu/In stack is heated in a reactive atmosphere containing Se forming a CuInSe$_2$ compound layer.

In another approach Cu—In or Cu—In—Ga alloys have been electroplated to form metallic precursor layers and then these precursor layers have been reacted with a Group VIA material to form CIGS type semiconductor layers. Some researchers electrodeposited all the components of the Group IBIIIAVIA compound layer. For example, for CIGS film growth electrolytes comprising Cu, In, Ga and Se were used. We will now review some of the work in this field.

Bonnet et al. (U.S. Pat. No. 5,275,714) electroplated Cu—In alloy layers out of acidic electrolytes that contained a suspension of fine Se particles. As described by Bonnet et al., this method yielded an electrodeposited Cu—In alloy layer which contained dispersed selenium particles since during electrodeposition of Cu and In, the Se particles near the surface of the cathode got physically trapped in the growing layer. Lokhande and Hodes (Solar Cells, vol. 21, 1987, p. 215) electroplated Cu—In alloy precursor layers for solar cell applications. Hodes et al. (Thin Solid Films, vol. 128, 1985, p. 93) electrodeposited Cu—In alloy films to react them with sulfur to form copper indium sulfide compound layers. They also experimented with an electrolyte containing Cu, In and S to form a Cu—In—S layer. Herrero and Ortega (Solar Energy Materials, vol. 20, 1990, p. 53) produced copper indium sulfide layers through H$_2$S-sulfidation of electroplated Cu—In films. Kumar et al (Semiconductor Science and Technology, vol. 6, 1991, p. 940, and also Solar Energy Materials and Solar Cells, vol.) formed a Cu—In/Se precursor stack by evaporating Se on top of an electroplated Cu—In film and then further processed the stack by rapid thermal annealing. Prosini et al (Thin Solid Films, vol. 288, 1996, p. 90, and also in Thin Solid Films, vol. 298, 1997, p. 191) electroplated Cu—In alloys out of electrolytes with a pH value of about 3.35-3.5. Ishizaki et al (Materials Transactions, JIM, vol. 40, 1999, p. 867) electroplated Cu—In alloy films and studied the effect of citric acid in the solution. Ganchev et al. (Thin Solid Films, vol. 511-512, 2006, p. 325, and also in Thin Solid Films, vol. 516, 2008, p. 5948) electrodeposited Cu—In—Ga alloy precursor layers out of electrolytes with pH values of around 5 and converted them into CIGS compound films by selenizing in a quartz tube.

Some researchers co-electrodeposited Cu, In and Se to form CIS or CuInSe$_2$ ternary compound layers. Others attempted to form CIGS or Cu(In,Ga)Se$_2$ quaternary compound layers by co-electroplating Cu, In, Ga and Se. Gallium addition in the quaternary layers was very challenging in the latter attempts. Singh et al (J. Phys. D: Appl. Phys., vol. 19, 1986, p. 1299) electrodeposited Cu—In—Se and determined that a low pH value of 1 was best for compositional control. Pottier and Maurin (J. Applied Electrochemistry, vol. 19, 1989, p. 361 electroplated Cu—In—Se ternary out of electrolytes with pH values between 1.5 and 4.5. Ganchev and Kochev (Solar Energy Matl. and Solar Cells, vol. 31, 1993, p. 163) carried out Cu—In—Se plating at a maximum pH value of 4.6. Kampman et al (Progress in Photovoltaics, vol. 7, 1999, p. 1999) described a CIS plating method. Other CIS and CIGS electrodeposition efforts include work by Bhattacharya et al (U.S. Pat. Nos. 5,730,852, 5,804,054, 5,871,630, 5,976,614, and 7,297,868), Jost et al (Solar Energy Matl. and Solar Cells, vol. 91, 2007, p. 636) and Kampmann et al (Thin Solid Films, vol. 361-362, 2000, p. 309).

The above mentioned plating baths employed for Cu—In, Cu—In—Ga, Cu—In—S, Cu—In—Se and Cu—In—Ga—Se layer depositions do not yield stable and repeatable electrodeposition process and high quality films that can be used in electronic device applications such as solar cell applications. Therefore, the present inventions aim to develop efficient electroplating baths to deposit smooth and defect-free Group IB-Group IIIA alloy or mixture films as well as Group IB-Group IIIA-Group VIA alloy or mixture layers in a repeatable manner with controlled composition.

SUMMARY OF THE INVENTION

An aspect of the present inventions provide an electrodeposition solution for deposition of a Group IB-IIIA thin film on a conductive surface, the electrodeposition solution comprising: a solvent; a Group IB material source that dissolves in the solvent and provides a Group IB material; a Group IIIA material source that dissolves in the solvent and provides a Group IIIA material; and a blend of at least two complexing agents, a first complexing agent forming a complex with the Group IB material and a second complexing agent forming a complex with the Group IIIA material; wherein the pH of the solution is at least 7.

In another aspect, each of the first and the second complexing agents comprises at least one of a carboxylate functional group and an amine functional group.

In another aspect of the present inventions the electrodeposition solution comprises Cu as the Group IB material, and comprises at least one of In and Ga as the Group IIIA material.

Yet in another aspect the blend of the at least two complexing agents comprise a citrate and a tartrate.

In a different aspect, there is an electrodeposition solution for deposition of a Group IB-IIIA-VIA thin film on a conductive surface, the electrodeposition solution comprising: a solvent; a Group IB material source that dissolves in the solvent and provides a Group IB material; a Group IIIA material source that dissolves in the solvent and provides a Group IIIA material; a Group VIA material source that dissolves in the solvent and provides a Group VIA material; an at least one complexing agent that complexes with the Group IB and Group IIIA materials; wherein the pH of the solution is at least 7.

Another aspect is the above electrodeposition solution wherein each of the first and the second complexing agents comprises at least one of a carboxylate functional group and an amine functional group.

Another aspect is the above electrodeposition solution wherein the Group IIIA material comprises both In and Ga and the blend of the at least two complexing agents comprise a tartrate and a citrate.

BRIEF DESCRIPTION OF THE DRAWING

These and other aspects and features of the present invention will become apparent to those of ordinary skill in the art upon review of the following description of specific embodiments of the invention in conjunction with the accompanying FIGURE, wherein:

FIG. 1 is a schematic view of a prior art solar cell structure.

DETAILED DESCRIPTION OF THE PREFERRED EMBODIMENTS

The preferred embodiment, as describe herein, provide methods and electroplating baths or electrolytes to co-electrodeposit (also called electrodeposit or electroplate or plate from now on) uniform, smooth and compositionally repeatable "Group IB-Group IIIA" alloy or mixture films where the Group IB material is Cu and the Group IIIA material is at least one of In and Ga. Such films include Cu—In, Cu—Ga and Cu—In—Ga alloy or mixture films. These embodiments also provide methods and electroplating baths or electrolytes to co-electrodeposit uniform, smooth and compositionally repeatable "Group IB-Group IIIA-Group VIA" alloy or mixture films where the Group IB material comprises Cu, the Group IIIA material comprises at least one of In and Ga and the Group VIA material comprises at least one of Se, Te and S. These films include layers of $Cu(In,Ga)(S,Te,Se)_2$. The stoichiometry or composition of such films, e.g. Group IB/Group IIIA atomic ratio, may be controlled by varying the appropriate plating conditions. Through the use of embodiments described herein it is possible to form micron or sub-micron thick alloy or mixture films on conductive contact layer surfaces for the formation of solar cell absorbers.

It should be noted that the prior art plating solutions for the above mentioned group of materials have an acidic pH range of <7. The embodiments described herein use a neutral (pH=7) to basic (pH>7) range for the pH of the solutions and employ at least one complexing agent to effectively complex one of Cu, In and Ga at this pH value. Present inventors recognized the benefits of such high pH ranges and use of specific complexing agents for the electrodeposition of Ga containing metallic layers (see for example, U.S. patent application Ser. No. 11/535,927, filed Sep. 27, 2006, entitled "Efficient Gallium Thin Film Electroplating Methods and Chemistries", now U.S. Pat. No. 7,507,321), (In,Ga)—Se containing layers (see for example, U.S. patent application Ser. No. 12/123,372, filed May 19, 2008, entitled "Electroplating Methods and Chemistries for Deposition of Group IIIA-Group VIA thin films") and Se layers (see for example, U.S. patent application Ser. No. 12/121,687, filed May 15, 2008, entitled "Selenium Electroplating Chemistries and Methods"), each of which are explicitly incorporated be reference herein. Various aspects of the present inventions will now be described.

1) Group IB-IIIA metallic layer deposition: In this embodiment the preferred electroplating bath comprises Cu, at least one Group IIIA (Ga and In) material, and a blend of at least two complexing agents that have the ability to complex with Cu and the Group IIIA species to keep them from precipitating in the non-acidic electrolyte which has a pH value of larger than or equal to 7. As is commonly known in the art of electrodeposition, complexing agents are soluble species that combine with metal ions in solution to form soluble complexes or complex ions. It should be noted that the acidic solutions of the prior art techniques may not have used such complexing agents since Group IIIA species typically remain in solution at acidic pH values. Although various complexing agents such as tartaric acid, citric acid, acetic acid, malonic acid, malic acid, succinic acid, ethylenediamine (EN), ethylenediaminetetra acetic acid (EDTA), nitrilotriacetic acid (NTA), and hydroxyethylethylenediaminetriacetic acid (HEDTA), etc. may be employed in the plating bath, the preferred complexing agents are tartaric acid or a tartrate, such as potassium sodium tartrate ($KNaC_4H_4O_6$) and citric acid or a citrate such as sodium citrate.

Copper in the electrolyte may be provided by a Cu source such as dissolved Cu metal or a Cu salt such as Cu-sulfate, Cu-chloride, Cu-acetate, Cu-nitrate, etc. The Group IIIA material source comprises at least one of dissolved In and Ga metals, and dissolved In and Ga salts, wherein the In salts may include In-chloride, In-sulfate, In-sulfamate, In-acetate, In-carbonate, In-nitrate, In-phosphate, In-oxide, In-perchlorate, and In-hydroxide, etc., and wherein the Ga salts may include Ga-chloride, Ga-sulfate, Ga-sulfamate, Ga-acetate, Ga-carbonate, Ga-nitrate, Ga-perchlorate, Ga-phosphate, Ga-oxide, and Ga-hydroxide, etc.

The preferred complexing agent for electrolytes used for Cu—Ga layer electroplating comprises citric acid or a citrate. The preferred complexing agent for electrolytes used for Cu—In film electroplating comprises tartaric acid or a tartrate. The preferred blend of complexing agents used for Cu—In—Ga film electroplating comprises both citrate and tartrate. Using such specific blend of complexing agents at the neutral and high pH ranges improves the plating efficiencies of these Group IB-IIIA materials. Citrates in the blend complex efficiently with the Ga species, tartrates in the blend complex efficiently with the In species. Both tartrates and citrates, on the other hand, complex well with Cu species. Therefore, in electrolytes comprising Cu and both In and Ga species, it is beneficial to include a blend of complexing agents comprising both tartrates (or tartaric acid) and citrates (or citric acid) to obtain high plating efficiencies and good compositional control, i.e. Cu/In, Cu/Ga, In/Ga, Cu/(In+Ga) molar ratios. It should be noted that other complexing agents may additionally be included in the solution formulation.

As stated above the solutions or electrolytes used in the embodiments herein preferably have pH values of 7 or higher. A more preferred pH range is above 9. These basic pH values are suitable for large scale manufacturing and provide good complexation for all of the Cu, In and Ga species in the electrolyte and bring their plating potentials close to each other for better repeatability and control of the plated alloy film compositions. It is for this reason that the Ga content of the Cu—In—Ga layers of the embodiments may be controlled at will in a range from 0% to 100%. This is unlike prior art plating solutions and methods which generally had difficulty to include appreciable amount of Ga in the electroplated layers due to excessive hydrogen generation due to high negative plating potential of Ga out of acidic electrolytes.

2) Group IB-IIIA-VIA layer deposition: In this embodiment the electroplating bath comprises Cu, at least one Group IIIA (Ga and In) material, at least one Group VIA material (Se, S and Te) and at least one complexing agent that has the ability to complex with Cu and the Group IIIA species to keep them from precipitating in the non-acidic electrolyte which has a pH value of larger than or equal to 7. A unique property of the relatively high pH electrolytes of the embodiments herein is the fact that Group VIA materials such as Se, S and Te are soluble in basic solutions, and therefore even if they do not complex well with the complexing agents, they do not form precipitates. Therefore, the neutral to alkali (or basic) pH values (pH values larger than or equal to about 7) of the plating chemistries have the ability to keep all of the Group IB, Group IIIA and Group VIA species in solution without precipitation. As explained above, the Group IB and Group IIIA species are believed to be kept in solution without precipitation through complexing with the complexing agent, and the Group VIA species are believed to be kept in solution without precipitation through chemical dissolution at the high pH values. In addition to keeping these two species in solution, the unique chemistry of the embodiments herein also brings their deposition potentials close to each other so that co-electroplating of ternary films of Cu—In—Se, Cu—In—S, Cu—Ga—Se, and Cu—Ga—S, or electroplating of quaternary and pentenary films of Cu—In—Ga—Se, Cu—In—Ga—S, Cu—In—S—Se, Cu—Ga—S—Se and Cu—In—Ga—Se—S may be performed in such neutral and high pH solutions.

A preferred embodiment uses a blend of at least two complexing agents in plating solutions used to electrodeposit Group IB-IIIA-VIA layer. The blend of the complexing agents is designed so that one complexing agent in the blend may complex well with one of the species (for example at least one of Cu, In, Ga species) in the plating solution, whereas another complexing agent in the blend may complex well with another species in the plating solution. The type and the concentration of the complexing agents in the blend are selected to optimize the complexation of the targeted species so that they do not form precipitates and their plating potentials are adjusted with respect to each other. For example, for electrodeposition of a Cu—In—Ga—Se films a blend of complexing agents comprising a tartrate and citrate is preferred because the tartrate complexes well with the In species and the citrate complexes well with the Ga species, allowing relatively independent optimization and control of their respective complexation and plating characteristics.

Although various complexing agents such as tartaric acid, citric acid, acetic acid, malonic acid, malic acid, succinic acid, ethylenediamine (EN), ethylenediaminetetra acetic acid (EDTA), nitrilotriacetic acid (NTA), and hydroxyethylethylenediaminetriacetic acid (HEDTA), etc. may be employed in the plating bath for deposition of ternary and higher order materials listed above, the preferred complexing agents are tartaric acid or a tartrate, such as potassium sodium tartrate ($KNaC_4H_4O_6$) and citric acid or a citrate such as sodium citrate, lithium citrate, ammonium citrate, potassium citrate, and an organically modified citrate.

Copper in the electrolyte may be provided by a Cu source such as dissolved Cu metal or a Cu salt such as Cu-sulfate, Cu-chloride, Cu-acetate, Cu-nitrate, etc. The Group IIIA material source may comprise at least one of dissolved In and Ga metals and dissolved In and Ga salts, wherein the In salts include In-chloride, In-sulfate, In-sulfamate, In-acetate, In-carbonate, In-nitrate, In-phosphate, In-oxide, In-perchlorate, and In-hydroxide, etc., and wherein the Ga salts include Ga-chloride, Ga-sulfate, Ga-sulfamate, Ga-acetate, Ga-carbonate, Ga-nitrate, Ga-perchlorate, Ga-phosphate, Ga-oxide, and Ga-hydroxide, etc. Group VIA material may be provided by at least one of a Se source, a S source and a Te source. The Group VIA material source may comprise at least one of dissolved elemental Se, Te and S, acids of Se, Te and S, and dissolved Se, Te and S compounds, wherein the Se, Te and S compounds include oxides, chlorides, sulfates, sulfides, nitrates, perchlorides and phosphates of Se, Te and S. Some of the preferred sources include but are not limited to selenous acid (also known as selenious acid) ($H_2SeO_3$), selenium dioxide ($SeO_2$), selenic acid ($H_2SeO_4$), selenium sulfides ($Se_4S_4$, $SeS_2$, $Se_2S_6$), sodium selenite ($Na_2SeO_3$), telluric acid ($H_6TeO_6$), tellurium dioxide ($TeO_2$), selenium sulfides ($Se_4S_4$, $SeS_2$, $Se_2S_6$), thiourea ($CSN_2H_4$), and sodium thiosulfate ($Na_2S_2O_3$).

The preferred complexing agent for the electrolytes used for electroplating Ga-containing layers, for example the Cu—Ga-Group VIA layers, such as Cu—Ga—Se, Cu—Ga—Te, Cu—Ga—S, Cu—Ga—S—Se, Cu—Ga—S—Te, Cu—Ga—Se—Te layers, comprises citric acid or a citrate. The preferred complexing agent for electrolytes used for electroplating In-containing layers, for example Cu—In—Se, Cu—In—S, Cu—In—Te, Cu—In—S—Se, Cu—In—S—Te, and Cu—In—Se—Te layers comprises tartaric acid or a tartrate. The preferred blend of complexing agents used for the electrolytes employed for electroplating both Ga and In containing layers such as Cu—In—Ga—Se, Cu—In—Ga—S, Cu—In—Ga—Te, Cu—In—Ga—S—Te, Cu—In—Ga—Se—Te and Cu—In—Ga—S—Se comprise both citrate and tartrate. Using such blend of complexing agents at the neutral and high pH ranges improves the plating efficiencies of these Group IB-IIIA-VIA materials, which may be in the form of alloys or mixtures. Citrates complex efficiently with Ga species and tartrates complex efficiently with In species. Both tartrates and citrates complex well with Cu species. Group VIA materials of Se, S and Te, on the other hand, dissolve in the high pH solutions. As a result, solutions with no precipitating species are obtained. In electrolytes comprising Cu and both In and Ga species, it is beneficial to include both tartrates (or tartaric acid) and citrates (or citric acid) to obtain high plating efficiencies and good compositional control, i.e. Cu/In, Cu/Ga, In/Ga, Cu/(In+Ga) molar ratios. It should be noted that a Cu—In—Ga—Se alloy refers to a Cu(In,Ga)Se$_2$ compound film, whereas a Cu—In—Ga—Se mixture may comprise elemental Cu, In, Ga and Se, Cu—In, Cu—Ga, In—Ga, Cu—Se, In—Se, Ga—Se etc. species.

Tartrate sources include potassium sodium tartrate, other tartrate salts and compounds such as tartaric acid and diethyl L-tartrate and tartrate compounds and salts can including alkaline and alkaline earth metallic salts, ammonium salts of tartrates and organically modified tartrates such as alkyl or dialkyl tartrates.

Although water is the preferred solvent in the formulation of the plating baths of the preferred embodiments, it should be appreciated that organic solvents may also be added in the formulation, partially or wholly replacing the water. Such organic solvents include but are not limited to alcohols, acetonitrile, propylene carbonate, formamide, dimethyl sulfoxide, glycerin etc.

Although the DC voltage/current was utilized during the electrochemical co-deposition processes in the preferred embodiments, it should be noted that pulsed or other variable voltage/current sources may also be used to obtain high plating efficiencies and high quality deposits. Also these different electrochemical methods may be contributed to control the Group IIIA/Group VIA molar ratio in the electroplated layers. The temperature of the electroplating baths may be in the range of 5-120° C. depending upon the nature of the solvent. The preferred bath temperature for water based formulation is in the range of 10-90° C.

The electroplating baths of the preferred embodiments may comprise additional ingredients. These include, but are not limited to, grain refiners, surfactants, dopants, other metallic or non-metallic elements etc. For example, organic additives such as surfactants, suppressors, levelers, accelerators etc. may be included in the formulation to refine its grain structure and surface roughness. Organic additives include but are not limited to polyalkylene glycol type polymers, propane sulfonic acids, coumarin, saccharin, furfural, acryonitrile, magenta dye, glue, SPS, starch, dextrose, and the like.

Although the preferred Group IB element in the preferred embodiments is Cu, other Group IB elements such as Ag may also be used in place of or in addition to Cu in the electrolytes.

Although the present inventions are described with respect to certain preferred embodiments, modifications thereto will be apparent to those skilled in the art.

Aspects and combinations of these inventions include:

An electrodeposition solution for deposition of a Group IB-IIIA thin film on a conductive surface, the electrodeposition solution comprising: a solvent; a Group IB material source that dissolves in the solvent and provides a Group IB material; a Group IIIA material source that dissolves in the solvent and provides a Group IIIA material; and a blend of at least two complexing agents, one of the at least two complexing agent forming a complex with the Group IB material and the other one of the at least two complexing agent forming a complex with the Group IIIA material; wherein the pH of the solution is at least 7.0.

Another aspect is the above solution wherein each one of the at least two complexing agents comprises at least one of a carboxylate functional group and an amine functional group.

Another aspect is the above solution wherein the Group IB material comprises Cu and the Group IIIA material is at least one of In and Ga.

Another aspect is the above solution wherein the Group IIIA material comprises In and Ga.

Another aspect is the above solution wherein the at least two complexing agents comprise a citrate and a tartrate.

Another aspect is the above solution wherein the at least two complexing agents comprise a citrate and a tartrate.

Another aspect is the above solution wherein the citrate is at least one of citric acid, an alkali metal salt of citric acid, alkali earth metal salt of citric acid, and an organically modified citrate.

Another aspect is the above solution wherein the alkali and alkali earth metal salts of citric acid comprise at least one of sodium citrate, lithium citrate, ammonium citrate, potassium citrate.

Another aspect is the above solution wherein the tartrate is at least one of tartaric acid, an alkali metal salt of tartaric acid, an alkali earth metal salt of tartaric acid, ammonium tartrate, tetraalkyl ammonium tartrate, alkyl tartrate, dialkyl tartrate, and organically modified tartrate.

Another aspect is the above solution wherein the alkali and alkali earth metal salts of tartaric acid comprise at least one of sodium tartrate, potassium tartrate, lithium tartrate, and potassium sodium tartrate.

Another aspect is the above solution wherein the Group IB material source comprises at least one of dissolved Cu metal and dissolved Cu salts, wherein the Cu salts include Cu-chloride, Cu-sulfate, Cu-acetate, Cu-nitrate, Cu-phosphate, and Cu-oxide, wherein the Group IIIA material source comprises at least one of dissolved In and Ga metals and dissolved In and Ga salts, wherein the In salts include In-chloride, In-sulfate, In-sulfamate, In-acetate, In-carbonate, In-nitrate, In-phosphate, In-oxide, In-perchlorate, and In-hydroxide, and wherein the Ga salts include Ga-chloride, Ga-sulfate, Ga-sulfamate, Ga-acetate, Ga-carbonate, Ga-nitrate, Ga-perchlorate, Ga-phosphate, Ga-oxide, and Ga-hydroxide.

Another aspect is the above solution wherein the solvent is water.

Another aspect is the above solution wherein the at least two complexing agents comprise at least one of an acid and an alkali metal salt of the acid, and wherein the acid comprises one of tartaric acid, citric acid, acetic acid, malonic acid, malic acid, succinic acid, ethylenediamine (EN), ethylenediaminetetra acetic acid (EDTA), nitrilotriacetic acid (NTA), and hydroxyethylethylenediaminetriacetic acid (HEDTA).

In a different aspect, there is an electrodeposition solution for deposition of a Group IB-IIIA-VIA thin film on a conductive surface, the electrodeposition solution comprising: a solvent; a Group IB material source that dissolves in the solvent and provides a Group IB material; a Group IIIA material source that dissolves in the solvent and provides a Group IIIA material; a Group VIA material source that dissolves in the solvent and provides a Group VIA material; an at least one complexing agent that complexes with the Group IB and Group IIIA materials;

wherein the pH of the solution is at least 7.

Another aspect is the above electrodeposition solution wherein the at least one complexing agent comprises a blend of two or more complexing agents.

Another aspect is the above electrodeposition solution wherein each one of the two or more complexing agents comprises at least one of a carboxylate functional group and an amine functional group.

Another aspect is the above electrodeposition solution wherein the Group IB material comprises Cu, the Group IIIA material is at least one of In and Ga, and the Group VIA material is at least one of Se, S and Te.

Another aspect is the above electrodeposition solution wherein the Cu source comprises at least one of dissolved Cu metal and dissolved Cu salts, wherein the Cu salts include Cu-chloride, Cu-sulfate, Cu-acetate, Cu-nitrate, Cu-phosphate, and Cu-oxide, wherein the Group IIIA material source comprises at least one of dissolved In and Ga metals and dissolved In and Ga salts, wherein the In salts include In-chloride, In-sulfate, In-sulfamate, In-acetate, In-carbonate, In-nitrate, In-phosphate, In-oxide, In-perchlorate, and In-hydroxide, and wherein the Ga salts include Ga-chloride, Ga-sulfate, Ga-sulfamate, Ga-acetate, Ga-carbonate, Ga-nitrate, Ga-perchlorate, Ga-phosphate, Ga-oxide, and Ga-hydroxide.

Another aspect is the above electrodeposition solution wherein the Group VIA material source comprises at least one of dissolved elemental Se, Te and S, and acids of Se, Te and S, and dissolved Se, Te and S compounds, wherein the Se, Te and S compounds include oxides, chlorides, sulfates, sulfides, nitrates, perchlorides and phosphates of Se, Te and S.

Another aspect is the above electrodeposition solution wherein the Group IIIA material comprises both In and Ga and the blend of two or more complexing agents comprise a tartrate and a citrate.

Another aspect is the above electrodeposition solution wherein the tartrate comprises at least one of tartaric acid, an alkali metal salt of tartaric acid, an alkali earth metal salt of tartaric acid, ammonium tartrate, tetraalkyl ammonium tartrate, alkyl tartrate, dialkyl tartrate, and organically modified tartrate, and wherein the citrate comprises at least one of citric acid, an alkali metal salt of citric acid, alkali earth metal salt of citric acid, and an organically modified citrate.

Although the present inventions have been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

We claim:

1. An electroplating solution for electroplating of a CIGS thin film on a conductive surface, the electroplating solution comprising:
   a solvent;
   a Group IB material source that dissolves in the solvent and provides a Group IB material, the Group IB material including Cu;
   a Group IIIA material source that dissolves in the solvent and provides a Group IIIA material, the Group IIIA material including Ga and In;

a Group VIA material source that dissolves in the solvent and provides a Group VIA material, the Group VIA material including Se; and a blend of at least two complexing agents, including a first complexing agent forming a complex with the Group IB material and a second complexing agent forming a complex with the Group IIIA material; wherein the pH of the solution is at least 7.0.

2. The solution of claim 1 wherein the first and the second complexing agents each comprises at least one of a carboxylate functional group and an amine functional group.

3. The solution of claim 2 wherein one of the first and the second complexing agents is a citrate and another of the first and the second complexing agents is a tartrate.

4. The solution of claim 3 wherein the citrate is selected from the group consisting of citric acid, an alkali metal salt of citric acid, alkali earth metal salt of citric acid, and an organically modified citrate.

5. The solution of claim 4 wherein the alkali metal salts of citric acid are selected from the group consisting of sodium citrate, lithium citrate and potassium citrate.

6. The solution of claim 3 wherein the tartrate is selected from the group consisting of tartaric acid, an alkali metal salt of tartaric acid, an alkali earth metal salt of tartaric acid, ammonium tartrate, tetraalkyl ammonium tartrate, alkyl tartrate, dialkyl tartrate, and organically modified tartrate.

7. The solution of claim 6 wherein the alkali and alkali earth metal salts of tartaric acid are selected from the group consisting of sodium tartrate, potassium tartrate, lithium tartrate, and potassium sodium tartrate.

8. The solution of claim 2, wherein the Group IB material source comprises at least one of dissolved copper (Cu) metal and dissolved copper salts, wherein the copper salts include copper-chloride, copper-sulfate, copper-acetate, copper-nitrate, copper-phosphate, and copper-oxide, wherein the Group IIIA material source comprises at least one of dissolved indium (In) and gallium (Ga) metals and dissolved indium and gallium salts, wherein the indium salts include indium-chloride, indium-sulfate, indium-sulfamate, indium-acetate, indium-carbonate, indium-nitrate, indium-phosphate, indium-oxide, indium-perchlorate, and indium-hydroxide, and wherein the gallium salts include gallium-chloride, gallium-sulfate, gallium-sulfamate, gallium-acetate, gallium-carbonate, gallium-nitrate, gallium-perchlorate, gallium-phosphate, gallium-oxide, and gallium-hydroxide.

9. The solution of claim 8 wherein the solvent is water.

10. The solution of claim 2 wherein the at least two complexing agents comprise at least one of an acid, and an alkali metal salt of the acid, and ethylenediamine (EN), and wherein the acid comprises one of tartaric acid, citric acid, acetic acid, malonic acid, malic acid, succinic acid, -ethylenediaminetetra acetic acid (EDTA), nitrilotriacetic acid (NTA), and hydroxyethylethylenediaminetriacetic acid (HEDTA).

11. The solution of claim 1 wherein the thin film is a Group IB-IIIA-VIA thin film.

12. The solution of claim 11 wherein the first and the second complexing agents each comprises at least one of a carboxylate functional group and an amine functional group.

13. The solution of claim 12, wherein the Cu source comprises at least one of dissolved copper (Cu) metal and dissolved copper salts, wherein the copper salts include copper-chloride, copper-sulfate, copper-acetate, copper-nitrate, copper-phosphate, and copper-oxide, wherein the Group IIIA material source comprises at least one of dissolved indium (In) and gallium (Ga) metals and dissolved indium and gallium salts, wherein the indium salts include indium-chloride, indium-sulfate, indium-sulfamate, indium-acetate, indium-carbonate, indium-nitrate, indium-phosphate, indium-oxide, indium-perchlorate, and indium-hydroxide, and wherein the gallium salts include gallium-chloride, gallium-sulfate, gallium-sulfamate, gallium-acetate, gallium-carbonate, gallium-nitrate, gallium-perchlorate, gallium-phosphate, gallium-oxide, and gallium-hydroxide.

14. The solution of claim 13, wherein the Group VIA material source comprises at least one of dissolved elemental selenium (Se), tellurium (Te) and sulfur (S), and acids of selenium (Se), tellurium (Te) and sulfur (S), and dissolved selenium (Se), tellurium (Te) and sulfur (S) compounds, wherein the selenium (Se), tellurium (Te) and sulfur (S) compounds include oxides, chlorides, sulfates, sulfides, nitrates, perchlorides and phosphates of selenium (Se), tellurium (Te) and sulfur (S).

15. The solution of claim 14 wherein the blend of the at least two complexing agents comprise a tartrate and a citrate.

16. The solution of claim 15 wherein the tartrate is selected from the group consisting of tartaric acid, an alkali metal salt of tartaric acid, an alkali earth metal salt of tartaric acid, ammonium tartrate, tetraalkyl ammonium tartrate, alkyl tartrate, dialkyl tartrate, and organically modified tartrate, and wherein the citrate is selected from the group consisting of citric acid, an alkali metal salt of citric acid, alkali earth metal salt of citric acid, and an organically modified citrate.

* * * * *